(12) United States Patent
Ku (10) Patent No.: US 8,201,012 B2
(45) Date of Patent: Jun. 12, 2012

(54) LOAD ADAPTIVE EMI REDUCTION SCHEME FOR SWITCHING MODE POWER SUPPLY

(75) Inventor: Matthew Man Ho Ku, Irvine, CA (US)

(73) Assignee: Evergreen Micro Devices Co., Ltd., Shenzhen (CN)

( * ) Notice: Subject to any disclaimer, the term of this patent is extended or adjusted under 35 U.S.C. 154(b) by 516 days.

(21) Appl. No.: 12/429,727

(22) Filed: Apr. 24, 2009

(65) Prior Publication Data
US 2010/0275052 A1    Oct. 28, 2010

(51) Int. Cl.
*G06F 1/26* (2006.01)
(52) U.S. Cl. .................. 713/501; 713/300; 713/500
(58) Field of Classification Search .......... 713/300, 713/310, 340, 500, 501, 502; 323/265, 282
See application file for complete search history.

(56) References Cited

U.S. PATENT DOCUMENTS

| | | | |
|---|---|---|---|
| 5,644,743 A * | 7/1997 | Barrett et al. | 375/375 |
| 6,249,876 B1 | 6/2001 | Balakrishnan et al. | |
| 7,342,528 B2 * | 3/2008 | Ng et al. | 341/153 |
| 2006/0221646 A1 * | 10/2006 | Ye et al. | 363/13 |
| 2009/0115391 A1 * | 5/2009 | Chuang et al. | 323/283 |
| 2010/0117699 A1 * | 5/2010 | Wu et al. | 327/172 |

* cited by examiner

*Primary Examiner* — Paul Yanchus, III
(74) *Attorney, Agent, or Firm* — Morris Manning & Martin LLP; Tim Tingkang Xia, Esq.

(57) ABSTRACT

The present invention relates to a frequency jittering device and method, and a switching power supply employing such frequency jittering device. Said method comprises: S1 generating a variable logic number; S2 generating a delay signal; S3 generating a PWM control signal according to the variable logic number and the delay signal; S4 generating an output signal according to the PWM control signal; and S5 generating a clock signal with variable frequency according to the output signal; wherein, the clock signal is fed back to update the variable logic number, and a jittering clock signal modified in each clock cycle is produced. The benefit of the present invention is not only can apply small low cost EMI filter but also can keep the noise floor level low enough at light load condition.

13 Claims, 5 Drawing Sheets

LOAD ADAPTIVE EMI REDUCTION SCHEME FOR SWITCHING MODE POWER SUPPLY

REFERENCE TO RELATED PATENT DOCUMENT

U.S. Pat. No. 6,249,876, published on Jun. 19, 2001, and entitled "Frequency Jittering Control for Varying the Switching Frequency of a Power Supply" is cited herein in its entirety by reference for all purpose.

FIELD OF THE INVENTION

The present invention relates to a frequency jittering generator; and more specific, to a Frequency Jittering device that utilizes current or voltage control delay time circuit and digital control pulse width generator for varying both switching frequency and percentage of modulation swing period.

BACKGROUND OF THE INVENTION

A well-known issue with using switching mode power supply is its relative high operation switching frequency. This high frequency signal is coupled back into the AC mains input and becomes a component of the AC mains that can cause noise problems for those devices connected to the same AC mains power line. In addition, the high frequency signals are also radiated by the power supply as electromagnetic waves to create Electromagnetic Interference (EMI) that can also cause problems for communications devices in the neighborhood of the power supply.

Figure 1:
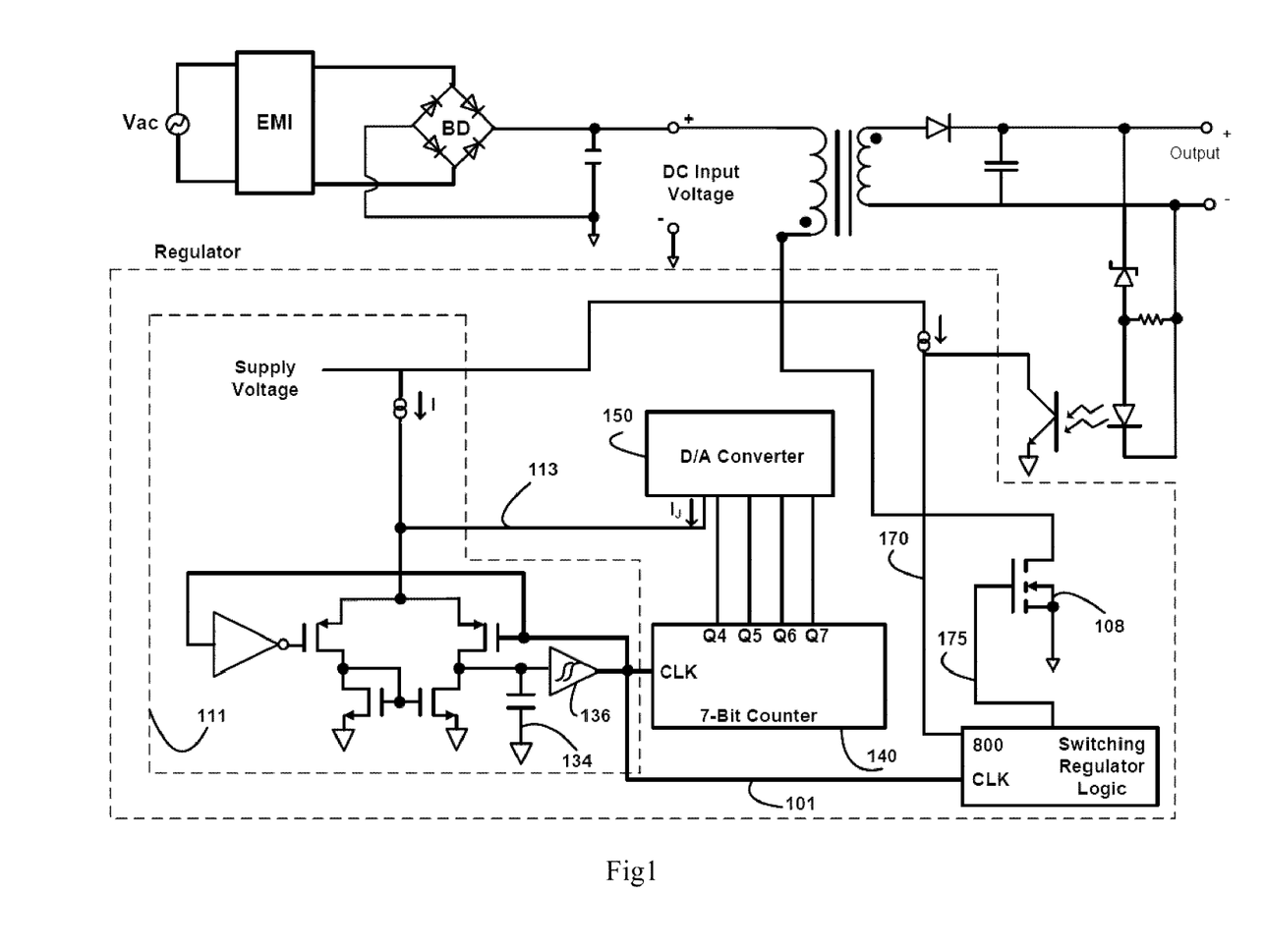
FIG. 1 is a schematic illustrating a frequency jittering scheme according with the prior art.

The common practice to alleviate the problem of EMI is by introduction of frequency jittering to spread the switching frequency over a wider bandwidth which can reduce the peak value of the EMI generated by the power supply at each frequency. One of examples of frequency jittering EMI reduction scheme is illustrated in FIG. 1 prior art. A Frequency Jittering device comprises a current control charge/discharge type oscillator 111, 7 bit digital counter 140 and Digital to Analog (D/A) converter 150. The oscillator 111 includes a capacitor 134 which is periodically charged and discharged. A hysteresis comparator 136 is used to detect the voltage level of the capacitor 134 and produces an output signal 101 which controls the charge and discharge of the capacitor 134 through charging and discharging circuit paths. The 7-bit counter 140 is then clocked by the oscillator output signal 101. The counter 140 outputs driver the D/A converter 150, whose output 113 is connected to the control input of the oscillator 111 for varying the oscillation frequency. The merit of this frequency jittering scheme is the elimination of an expensive and bulky EMI filter but its draw back is the rise of average noise floor which is not acceptable in certain application like in high fidelity audio system. For a high fidelity audio system, it can tolerate higher averaging output noise floor generated from switching power supply at high sound volume but becomes very noise sensitive at light sound volume.

Accordingly, a new frequency jittering scheme that can apply low cost simple EMI filter for EMI reduction but also can keep low level of switching power supply output noise floor at light load conditions is needed.

SUMMARY OF THE INVENTION

The objective of this invention is to overcome said problem of the prior art and provide a new frequency jittering scheme that can apply low cost simple EMI filter for EMI reduction but also can keep low level of switching power supply output noise floor at light load conditions.

The first technical solution employed by the present invention to solve such problems is constructing a frequency jittering device which comprising:

a Variable State Machine for generating a variable logic number;

a Time delay generator for generating a delay signal;

a Digital Control Pulse Density Generator for generating a PWM control signal according to the variable logic number and the delay signal;

a PWM Control Current Source for generating an output signal according to the PWM control signal; and a Current Control Oscillator for generating a clock signal with variable frequency according to the output signal;

wherein, the clock signal is fed back to the Variable State Machine to update the variable logic number, and a jittering clock signal modified in each clock cycle is produced.

Advantageously, the Digital Control Pulse Density Generator is used to create a series of pulse with different high-low density according to the variable logic number.

Advantageously, The pulse density function $P_{density}$ is expressed by equation (1):

$$P_{density}(n) = \frac{T_H(n)}{T_H(n) + T_L(n)} \qquad \text{Equation (1)}$$

Wherein, TH(n) and TL(n) represents the period of high and low pulse width respectively.

Advantageously, $T_H(n)+T_L(n)$ is always a constant value.

Advantageously, the PWM control signal $D_{PWM}$ is realized by adding the delay signal generated from Time Delay Generator into Pulse density function and given by equation (2):

$$D_{PWM}(n) = \frac{T_H(n) + T_D}{T_H(n) + T_L(n) + T_D} \qquad \text{Equation (2)}$$

Wherein, $T_D$ represents the delay signal.

Advantageously, the Digital Control Pulse Density Generator further comprises:

a ring oscillator realized with multiple of inverters connected in series;

a combinational logic circuit for generating different high-low density pulse train; and a multiplexer implemented with switch network controlled by a decoder;

wherein, the PWM control signal is realized by inserting the delay signal into the ring oscillator and receiving the variable logic number from the decoder.

Advantageously, the magnitude of output signal generated from PWM control current source is defined by equation (3).

$$I_c(D_{PWM}) = I_s \times D_{PWM} \qquad \text{Equation (3)}$$

where $I_s$ is a predefined constant current source.

Advantageously, the percentage swing of the frequency of the jittering clock signal can be expressed by equation (4):

$$\Delta OSC(Vc) = \frac{T_H(n) + T_L(n)}{T_H(n) + T_L(n) + T_D(Vc)} \times 100\% \qquad \text{Equation (4)}$$

The second technical solution employed by the present invention to solve such problems is constructing a frequency jittering method which comprising:

S1 generating a variable logic number;
S2 generating a delay signal;
S3 generating a PWM control signal according to the variable logic number and the delay signal;
S4 generating an output signal according to the PWM control signal; and
S5 generating a clock signal with variable frequency according to the output signal;

wherein, the clock signal is fed back to update the variable logic number and a jittering clock signal modified in each clock cycle is produced.

Advantagely, said step S3 further comprises creating a series of pulse with different high-low density according to the variable logic number.

Advantagely, The pulse density function $P_{density}$ is expressed by equation (1):

$$P_{density}(n) = \frac{T_H(n)}{T_H(n) + T_L(n)} \qquad \text{Equation (1)}$$

Wherein, TH(n) and TL(n) represents the period of high and low pulse width respectively.

Advantagely, $T_H(n)+T_L(n)$ is always a constant value.

Advantagely, the PWM control signal $D_{PWM}$ is realized by adding the delay signal generated from Time Delay Generator into Pulse density function and is given by equation (2):

$$D_{PWM}(n) = \frac{T_H(n) + T_D}{T_H(n) + T_L(n) + T_D} \qquad \text{Equation (2)}$$

Wherein, $T_D$ represents the delay signal.

Advantagely, the magnitude of output signal is defined by equation (3).

$$I_c(D_{PWM}) = I_s \times D_{PWM} \qquad \text{Equation (3)}$$

where $I_s$ is a predefined constant current source.

Advantagely, the percentage swing of the frequency of the jittering clock signal can be expressed by equation (4):

$$\Delta OSC(Vc) = \frac{T_H(n) + T_L(n)}{T_H(n) + T_L(n) + T_D(Vc)} \times 100\% \qquad \text{Equation (4)}$$

The third technical solution employed by the present invention to solve such problems is constructing a switching power supply which comprising an input circuit, wherein, it also comprises a feed back control loop formed by a Transformer; a Control; a Power Switch with drain connected to the primary winding of the Transformer, source grounded and gate connected to the Control, and an output circuit connected to the secondary winding of the Transformer;

Wherein, the Control is used to regulate the output voltage based on the jittering frequency with output adaptive frequency swing generated inside and a feedback signal provided by the feed back control loop.

Advantagely, the Control further comprises a Frequency Jittering device and a PWM Control, the Frequency Jittering device is used to generate a jittering frequency with output adaptive frequency swing based on a feedback signal provided by the feed back control loop; the PWM Control is used to vary the ratio of Power Switch on-off period and thus regulates the output voltage based on the jittering frequency with output adaptive frequency swing from the Frequency Jittering device and the feedback signal provided by the feed back control loop.

Advantagely, the frequency jittering device further comprises:

a Variable State Machine for generating a variable logic number;
a Time delay generator for generating a delay signal;
a Digital Control Pulse Density Generator for generating a PWM control signal according to the variable logic number and the delay signal;
a PWM Control Current Source for generating an output signal according to the PWM control signal; and
a Current Control Oscillator for generating a clock signal with variable frequency according to the output signal;

wherein, the clock signal is fed back to the Variable State Machine to update the variable logic number, and a jittering clock signal modified in each clock cycle is produced.

Advantagely, the Digital Control Pulse Density Generator is used to create a series of pulse with different high-low density according to the variable logic number.

Advantagely, The pulse density function $P_{density}$ is expressed by equation (1):

$$P_{density}(n) = \frac{T_H(n)}{T_H(n) + T_L(n)} \qquad \text{Equation (1)}$$

Wherein, TH(n) and TL(n) represents the period of high and low pulse width respectively.

Advantagely, $T_H(n)+T_L(n)$ is always a constant value.

Advantagely, the PWM control signal $D_{PWM}$ is realized by adding the delay signal generated from Time Delay Generator into Pulse density function and is given by equation (2):

$$D_{PWM}(n) = \frac{T_H(n) + T_D}{T_H(n) + T_L(n) + T_D} \qquad \text{Equation (2)}$$

Wherein, $T_D$ represents the delay signal.

Advantagely, the Digital Control Pulse Density Generator further comprises:

a ring oscillator realized with multiple of inverters connected in series;
a combinational logic circuit for generating different high-low density pulse train; and
a multiplexer implemented with switch network controlled by a decoder;

wherein, the PWM control signal is realized by inserting the delay signal into the ring oscillator and receiving the variable logic number from the decoder.

Advantagely, the magnitude of output signal generated from PWM control current source is defined by equation (3).

$$I_c(D_{PWM}) = I_s \times D_{PWM} \qquad \text{Equation (3)}$$

where $I_s$ is a predefined constant current source.

Advantagely, the percentage swing of the frequency of the jittering clock signal can be expressed by equation (4):

$$\Delta OSC(Vc) = \frac{T_H(n) + T_L(n)}{T_H(n) + T_L(n) + T_D(Vc)} \times 100\% \qquad \text{Equation (4)}$$

BRIEF DESCRIPTION OF THE DRAWINGS

So as to further explain the invention, an exemplary embodiment of the present invention will be described with reference to the below drawings, wherein.

DETAILED DESCRIPTION OF THE PREFERRED EMBODIMENT

These and other advantage, aspect and novel features of the present invention, as well as details of an illustrated embodiment thereof, will be more fully understand from the following description and drawings. While various embodiments of the present invention has been presented by way of example only, and not limitation.

The main concept of the present invention is to have wider frequency swing at heavy load to take advantage of prior art scheme by using small low cost EMI filter but have narrow frequency swing at light load to maintain low level of noise floor.

Figure 2:
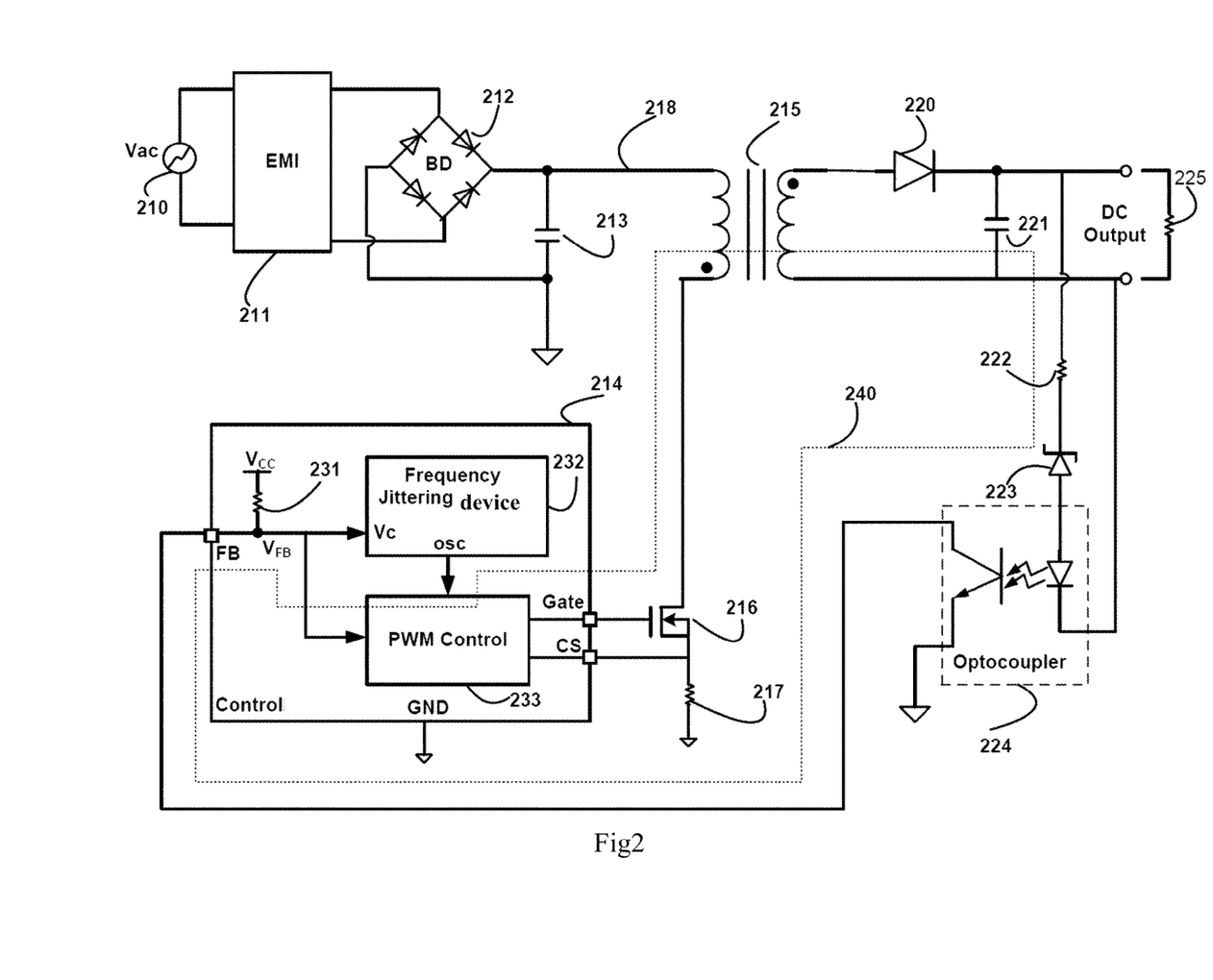
FIG. 2 is a schematic illustrating a power supply with a new frequency jittering scheme with load adaptive frequency swing.

FIG. 2 is a schematic illustrating a power supply with a new frequency jittering scheme with load adaptive frequency swing. Said power supply consists of an input circuit formed by EMI filter 211, Bridge Rectifier 212 and Filter Capacitor 213; Transformer 215, Control 214, Power Switch 216, Current Sense Resistor 217, and an output circuit formed by Output Diode 220, Output Capacitor 221, Output Voltage Sense Resistor 222, Zener Diode 223 and Optocoupler 224.

The AC line voltage 210 is first filtered by EMI filter 211 and then rectified by the Bridge Rectifier 212 to have a rectified line voltage at 218. Capacitor 213 is used to smooth out the rectified sinusoidal line voltage to have smaller ripple DC line voltage 218. The DC line voltage 218 is provided to Primary Winding of Transformer 215. The Power Switch 216 and Transformer 215, Output Diode 220 and Output Capacitor 221 form a Flyback converter. Energy stored in the primary winding of Transformer 215 when Power Switch 216 is on and energy released from the primary winding transferring to the Output Capacitor 221 and the load 225 when Power Switch 216 is off. The ratio of the Power Switch 216 on-off period defines the DC output voltage level.

Constant DC output voltage level is maintained by DC output feedback control loop 240 formed by Power Switch 216, Transformer 215, Output Diode 220, Output Voltage Sense 222, Zener diode 223, Optocoupler 224 and Control 214. Feedback to the Power Switch 216, which defines the ratio of switching on-off period, is achieved by using of feedback circuit, which is presently preferred to have a Zener diode 223 in series with a resistor 222 and Optocoupler 224. Optocoupler 224 provides a feedback current to FB pin of Control 214 which is then converted to a feedback voltage $V_{FB}$ through the resistor 231. The feedback voltage $V_{FB}$ coupled to functional block PWM control 233 is used to vary the ratio of Power Switch on-off period and thus regulates the output voltage. The feedback voltage $V_{FB}$ coupled to Frequency Jittering Control device 232 is used for frequency swing regulation. As $V_{FB}$ is converted from feedback current which is proportional to loading current through resistor 225, the percentage of frequency swing will be increased in response to the increase of loading current. Thus, a jittering frequency with load adaptive frequency swing is introduced to the DC output feedback control loop 240 through Frequency Jittering Control device 232. Although the voltage converted from feedback current is used in present preferred embodiment for load adaptive frequency swing, the voltage or current obtained from the average of the power supply current or switching duty cycle of Power Switch 216 are also can be used in present invention for load adaptive frequency swing without departing from the spirit and scope of the present invention.

Figure 3:
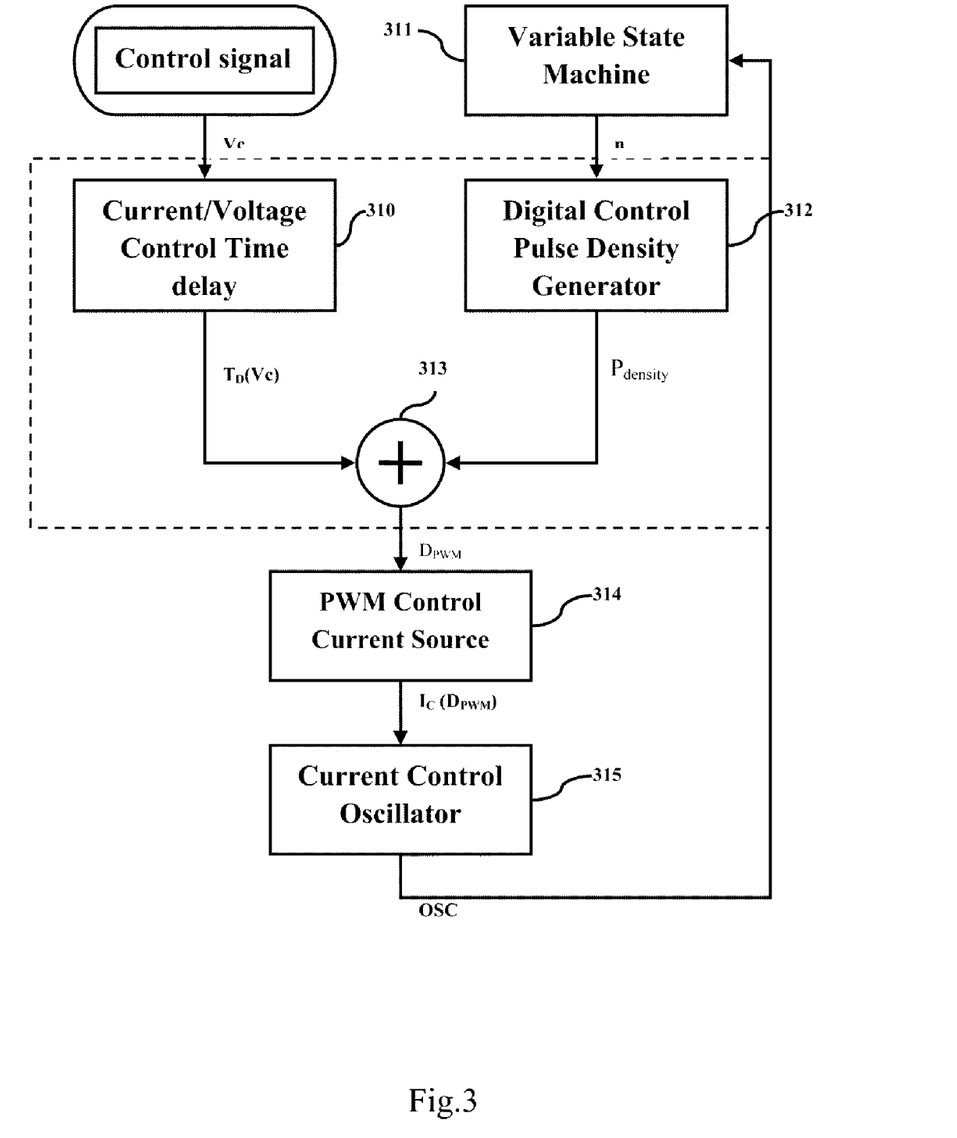
FIG. 3 shows a signal flow chart for varying a switching frequency and percentage of frequency swing of a power supply in accordance with the present invention.

Referring to the flow chart depicted in FIG. 3, a method for creating frequency jittering is described. Frequency jittering generation process can be divided into five operation processes while a constant delay time $T_D$ generated from Time delay generator 310 is assumed:

Process 1: Variable State Machine 311 breeds a state number n randomly or in predefined pattern per each clock cycle.

Process 2: Digital Control Pulse Density Generator 312 creates a series of pulse with different high-low density according to the output n from the Variable State Machine.

The pulse density function $P_{density}$ is expressed by equation (1):

$$P_{density}(n) = \frac{T_H(n)}{T_H(n) + T_L(n)} \quad \text{Equation (1)}$$

Wherein, TH(n) and TL(n) represents the period of high and low pulse width respectively. In addition, $T_H(n)+T_L(n)$ is always a constant value.

Process 3: The effective duty cycle of PWM control signal $D_{PWM}$ coupled to PWM Control Current Source 314 is set by adding the delay time $T_D$ generated from Time Delay Generator 310 into Pulse density function $P_{density}$ which is given by equation (2):

$$D_{PWM}(n) = \frac{T_H(n) + T_D}{T_H(n) + T_L(n) + T_D} \quad \text{Equation (2)}$$

Process 4: The magnitude of output current $I_c(D_{PWM})$ generated from PWM control current source 314 is controlled by the on period of PWM control signal $D_{PWM}$ and defined by equation (3).

$$I_c(D_{PWM}) = I_s \times D_{PWM} \quad \text{Equation (3)}$$

where $I_s$ is a predefined constant current source.

Process 5: A clock signal OSC with variable frequency $F_{OSC}$ in accordance with current $I_c$ is generated from Current Control Oscillator 315. This clock signal is also feedback to Variable State Machine 311 for updating the output state number n. As the state number n is different for each of clock cycle, the output clock frequency $F_{OSC}$ is modified in each clock cycle such that a jittering clock signal is produced.

The benefit of frequency jittering introduction is in lowering the effect of EMI of the switching power supply by spreading the switching power noise over a wider bandwidth, which minimizes the peak value of EMI generated by the power supply. The effect of the power noise spreading depends on the percentage swing of the switching frequency. For example, a higher percentage swing of the switching frequency results in a lower peak value of EMI being generated but end up with a higher noise floor. The percentage swing of the switching frequency is controlled by the control voltage Vc by varying the delay time $T_D$ through the Time delay generator 310. The percentage swing $\Delta OSC$ can be expressed by equation (4):

$$\Delta OSC(Vc) = \frac{T_H(n) + T_L(n)}{T_H(n) + T_L(n) + T_D(Vc)} \times 100\% \qquad \text{Equation (4)}$$

A present preferred time range for $T_D$ and $T_H(n)+T_L(n)$ is 1~2 μS and 0.05~0.1 μS respectively. For example, the percentage swing $\Delta OSC$ is 6.6% if $T_D$=1.5 μS and $T_H(n)+T_L(n)$=0.1 μS. Although the presently preferred frequency jittering scheme with load adaptive frequency swing use voltage control delay time configuration, the present invention is not to be construed as to be limited to such a configuration. Any other configurations according to equation (4) that can vary the percentage swing of switching frequency can be applied to this invention as well.

Figure 4:
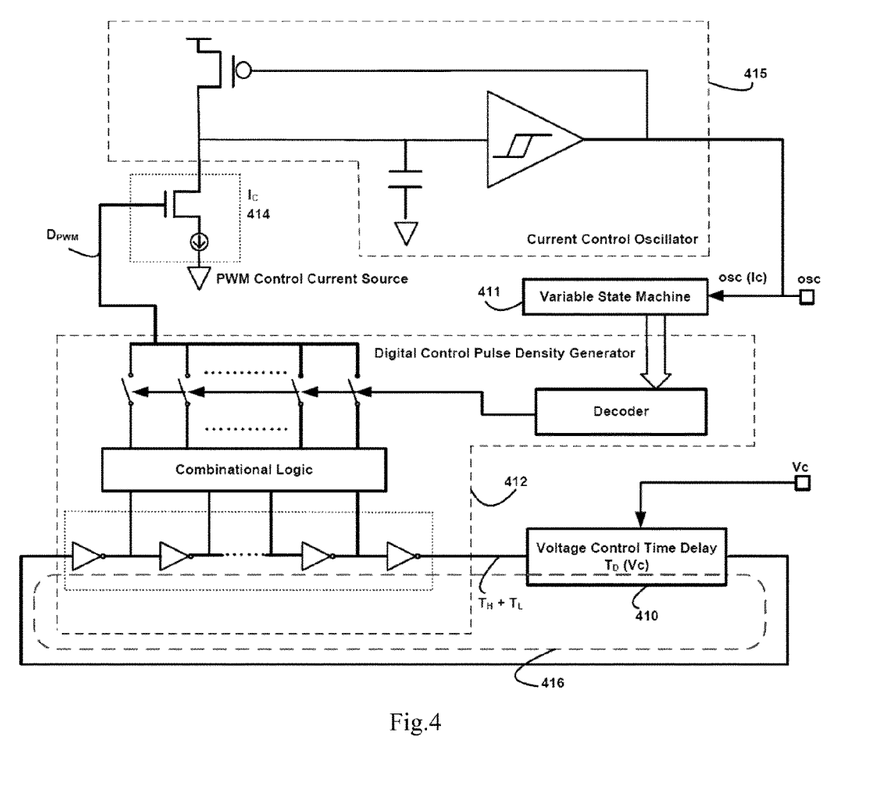
FIG. 4 is a block diagram illustrating a frequency jittering device for varying a switching frequency with controllable frequency swing in accordance with the flow chart of FIG. 3.

A preferred circuit implementation of a frequency jittering scheme with load adaptive frequency swing on the fly is disclosed. FIG. 4 is a block diagram illustrating a frequency jittering device for varying a switching frequency with controllable frequency swing in accordance with the flow chart of FIG. 3. The frequency jittering device comprises Voltage Control Time Delay 410, Variable State Machine 411, Digital Control Pulse Density Generator 412, PWM Control Current Source 414 and Current Control Oscillator 415.

Figure 5:
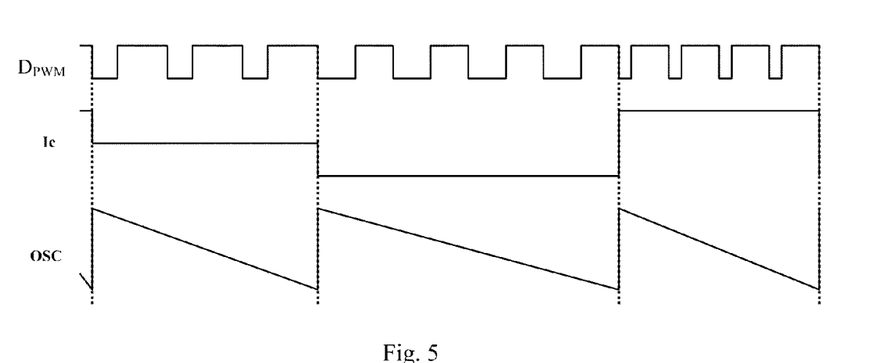
FIG. 5 is a timing diagram of the PWM control, Current control and oscillating signal illustrating the operation of the device of FIG. 4.

Variable State Machine 411 can be a pseudorandom data generator or any state machine that can generate variable logic number. This variable logic number is used by Digital Control Pulse Density Generator 412 to vary the high-low density of a pulse train according to equation (1). Digital Control Pulse Density Generator 412 includes a ring oscillator realized with multiple of inverters connected in series, a combinational logic circuit for generating different high-low density pulse train, and a multiplexer implemented with switch network controlled by a decoder. PWM control signal $D_{PWM}$ according to equation (2) can be realized by inserting the Voltage Control Time delay generator 410 within the ring oscillator loop 416 such that a controllable delay time $T_D$ is added to the cycle period $T_H(n)+T_L(n)$, which is defined in Digital Control Pulse Density Generator 412. A typical PWM control signal $D_{PWM}$ waveform is depicted in FIG. 5. This PWM Control Signal is coupled to the PWM Control Current Source 414. It can be simply implemented with a switch and constant current source connected in series as shown in FIG. 4. The average output current $I_c$ is determined by the effective duty cycle of the PWM control signal according to equation (3). As shown in FIG. 5, the higher the on duty cycle, the higher the current of $I_c$. The magnitude of $I_c$ defines the output frequency of Current Control Oscillator 415. In present invention, a relaxation type oscillator is used. It is constructed by a comparator with hysteresis, capacitor, PMOS switch for capacitor charging instantly and PWM control current source for capacitor discharge gradually. A typical output waveform OSC of this relaxation oscillator is shown in FIG. 5.

The foregoing description is just the preferred embodiment of the invention. It is not intended to exhaustive or to limit the invention. Any modifications, variations, and amelioration without departing from the spirit and scope of the present invention should be included in the scope of the prevent invention.

The invention claimed is:

1. A frequency jittering device, comprising:
    a Variable State Machine for generating a variable logic number;
    a Time delay generator for generating a delay signal;
    a Digital Control Pulse Density Generator for generating a PWM control signal according to the variable logic number and the delay signal;
    a PWM Control Current Source for generating an output signal according to the PWM control signal; and
    a Current Control Oscillator for generating a clock signal with variable frequency according to the output signal;
    wherein the clock signal is fed back to the Variable State Machine to update the variable logic number, and a jittering clock signal modified in each clock cycle is produced;
    wherein the Digital Control Pulse Density Generator comprises:
        a ring oscillator realized with multiple inverters connected in series;
        a combinational logic circuit for generating different high-low density pulse trains; and
        a multiplexer implemented with a switch network controlled by a decoder; and
    wherein the PWM control signal is realized by inserting the delay signal into the ring oscillator and receiving the variable logic number from the decoder.

2. The frequency jittering device according to claim 1, wherein the Digital Control Pulse Density Generator is used to create a series of pulses with different high-low densities according to the variable logic number.

3. The frequency jittering device according to claim 2, wherein a pulse density function $P_{density}$ is expressed by equation (1):

$$P_{density}(n) = \frac{T_H(n)}{T_H(n) + T_L(n)} \qquad \text{Equation (1)}$$

wherein $T_H(n)$ and $T_L(n)$ represents the period of high and low pulse width respectively.

4. The frequency jittering device according to claim 3, wherein $T_H(n)+T_L(n)$ is always a constant value.

5. The frequency jittering device according to claim 3, wherein the PWM control signal $D_{PWM}$ is realized by adding the delay signal generated from Time Delay Generator into the pulse density function and is given by equation (2):

$$D_{PWM}(n) = \frac{T_H(n) + T_D}{T_H(n) + T_L(n) + T_D} \qquad \text{Equation (2)}$$

wherein $T_D$ represents the delay signal.

6. The frequency jittering device according to claim 5, wherein a magnitude of the output signal generated from the PWM control current source is defined by equation (3):

$$I_c(D_{PWM}) = I_s \times D_{PWM} \qquad \text{Equation (3)}$$

where $I_s$ is a predefined constant current source.

7. The frequency jittering device according to claim 5, wherein a percentage swing of the frequency of the jittering clock signal can be expressed by equation (4):

$$\Delta OSC(V_C) = \frac{T_H(n) + T_L(n)}{T_H(n) + T_L(n) + T_D(V_C)} \times 100\% \quad \text{Equation (4)}$$

8. A frequency jittering method, comprising:
S1 generating a variable logic number;
S2 generating a delay signal;
S3 generating a PWM control signal according to the variable logic number and the delay signal;
S4 generating an output signal according to the PWM control signal; and
S5 generating a clock signal with variable frequency according to the output signal;
wherein the clock signal is fed back to update the variable logic number, and a jittering clock signal modified in each clock cycle is produced;
wherein said step S3 further comprises creating a series of pulses with different high-low densities according to the variable logic number;
a pulse density function $P_{density}$ is expressed by equation (1):

$$P_{density}(n) = \frac{T_H(n)}{T_H(n) + T_L(n)} \quad \text{Equation (1)}$$

wherein $T_H(n)$ and $T_L(n)$ represents the period of high and low pulse width respectively; and the PWM control signal $D_{PWM}$ is realized by adding the delay signal into the pulse density function and is given by equation (2):

$$D_{PWM}(n) = \frac{T_H(n) + T_D}{T_H(n) + T_L(n) + T_D} \quad \text{Equation (2)}$$

wherein $T_D$ represents the delay signal.

9. The frequency jittering method according to claim 8, wherein $T_H(n)+T_L(n)$ is always a constant value.

10. The frequency jittering method according to claim 8, wherein a magnitude of the output signal is defined by equation (3):

$$I_c(D_{PWM}) = I_s \times D_{PWM} \quad \text{Equation (3)}$$

where $I_s$ is a predefined constant current source.

11. The frequency jittering method according to claim 8, wherein a percentage swing of the frequency of the jittering clock signal can be expressed by equation (4):

$$\Delta OSC(V_C) = \frac{T_H(n) + T_L(n)}{T_H(n) + T_L(n) + T_D(V_C)} \times 100\% \quad \text{Equation (4)}$$

12. A switching power supply comprising:
an input circuit;
a feed back control loop formed by a Transformer;
a Control;
a Power Switch with drain connected to the primary winding of the Transformer, source grounded and gate connected to the Control; and
an output circuit connected to the secondary winding of the Transformer;
wherein the Control is used to regulate an output voltage based on a jittering frequency with output adaptive frequency swing generated inside and a feedback signal provided by the feed back control loop;
the Control further comprises a Frequency Jittering device and a PWM Control, the Frequency Jittering device is used to generate the jittering frequency with output adaptive frequency swing based on the feedback signal provided by the feed back control loop; the PWM Control is used to vary a ratio of Power Switch on-off period and thus regulates the output voltage based on the jittering frequency with output adaptive frequency swing from the Frequency Jittering device and the feedback signal provided by the feed back control loop;
the Frequency Jittering device further comprises:
a Variable State Machine for generating a variable logic number;
a Time delay generator for generating a delay signal;
a Digital Control Pulse Density Generator for generating a PWM control signal according to the variable logic number and the delay signal;
a PWM Control Current Source for generating an output signal according to the PWM control signal; and
a Current Control Oscillator for generating a clock signal with variable frequency according to the output signal;
wherein the clock signal is fed back to the Variable State Machine to update the variable logic number, and a jittering clock signal modified in each clock cycle is produced;
the Digital Control Pulse Density Generator further comprises:
a ring oscillator realized with multiple inverters connected in series;
a combinational logic circuit for generating different high-low density pulse trains; and
a multiplexer implemented with a switch network controlled by a decoder;
wherein the PWM control signal is realized by inserting the delay signal into the ring oscillator and receiving the variable logic number from the decoder.

13. The switching power supply according to claim 12, wherein the Digital Control Pulse Density Generator is used to create a series of pulses with different high-low densities according to the variable logic number;
wherein a pulse density function $P_{density}$ is expressed by equation (1):

$$P_{density}(n) = \frac{T_H(n)}{T_H(n) + T_L(n)} \quad \text{Equation (1)}$$

wherein $T_H(n)$ and $T_L(n)$ represents the period of high and low pulse width respectively.

* * * * *